United States Patent
Hong et al.

(10) Patent No.: US 11,942,907 B2
(45) Date of Patent: Mar. 26, 2024

(54) AMPLIFIER

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyeokki Hong, Suwon-si (KR); Jihun Lee, Daejeon (KR); Gyuhyeong Cho, Daejeon (KR); Cheheung Kim, Yongin-si (KR); Hyunwook Kang, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 17/322,222

(22) Filed: May 17, 2021

(65) Prior Publication Data
US 2022/0166391 A1 May 26, 2022

(30) Foreign Application Priority Data

Nov. 23, 2020 (KR) .................. 10-2020-0158029

(51) Int. Cl.
*H03F 3/45* (2006.01)
*H03F 3/00* (2006.01)

(52) U.S. Cl.
CPC ......... *H03F 3/005* (2013.01); *H03F 3/45179* (2013.01); *H03F 2203/45244* (2013.01)

(58) Field of Classification Search
CPC ...... H03F 3/005; H03F 3/45179; H03F 3/303; H03F 3/45192; H03F 3/45475;
(Continued)

(56) References Cited

U.S. PATENT DOCUMENTS 5,216,380 A * 6/1993 Carbou ............... H03F 3/45659
330/261
6,150,883 A * 11/2000 Ivanov .................. H03F 3/3028
330/253

(Continued)

FOREIGN PATENT DOCUMENTS

KR  10-1820499 B1  1/2018
KR  10-2019-0079096 A  7/2019

OTHER PUBLICATIONS

Samavati et al., "A new $g_m$-boosting design technique for wideband inductorless low-noise transconductance amplifiers," Elsevier, Microelectronics Journal, vol. 95, No. 104659, 2020, Total 7 pages.

(Continued)

*Primary Examiner* — Andrea Lindgren Baltzell
*Assistant Examiner* — Khiem D Nguyen
(74) *Attorney, Agent, or Firm* — Sughrue Mion, PLLC

(57) ABSTRACT

The amplifier includes an input circuit configured to convert an input signal into a current; an output circuit comprising at least one switching element for reducing a voltage change of an output end of the input circuit and configured to provide an output signal; and a biasing circuit connected to the at least one switching element to form a feedback loop for reducing the voltage change of the output end of the input circuit.

19 Claims, 9 Drawing Sheets

(58) Field of Classification Search
CPC . H03F 2203/45244; H03F 2203/30021; H03F 2203/45288; H03F 2203/45134; H03F 2200/555
USPC .......................................... 330/252–255, 258
See application file for complete search history.

(56) References Cited

U.S. PATENT DOCUMENTS

| | | | |
|---|---|---|---|
| 6,469,579 B2* | 10/2002 | Bazes | H03F 3/45677 330/253 |
| 9,099,969 B2 | 8/2015 | Sutardja et al. | |
| 9,871,494 B2 | 1/2018 | Gupta et al. | |
| 10,707,820 B2 | 7/2020 | Choi et al. | |
| 2006/0012433 A1 | 1/2006 | Chung | |
| 2012/0119833 A1 | 5/2012 | Luff | |
| 2015/0362935 A1 | 12/2015 | Patel et al. | |
| 2017/0359041 A1 | 12/2017 | Morley | |

OTHER PUBLICATIONS

Mehta et al., "A 1-mW Class-AB Amplifier With—101 dB THD+N for High-Fidelity 16 Ω Headphones in 65-nm CMOS," IEEE Journal of Solid-State Circuits, vol. 54, No. 4, pp. 948-958, Apr. 2019.

Dhanasekaran et al., "Design of Three-Stage Class-AB 16 Ω Headphone Driver Capable of Handling Wide Range of Load Capacitance," IEEE Journal of Solid-State Circuits, vol. 44, No. 6, pp. 1734-1744, Jun. 2009.

Jiang et al., "A Low-Power, High-Fidelity Stereo Audio Codec in 0.13 μm CMOS," IEEE Journal of Solid-State Circuits, vol. 47, No. 5, pp. 1221-1231, May 2012.

Wen et al., "A 5.2mW, 0.0016% THD up to 20kHz, Ground-Referenced Audio Decoder with PSRR-enhanced Class-AB 16Ω Headphone Amplifiers," IEEE, 2012 Symposium on VLSI Circuits Digest of Technical Papers, pp. 20-21, 2012.

Abdelfattah et al., "A 40 nm Fully Integrated 82 mW Stereo Headphone Module for Mobile Applications," IEEE Journal of Solid-State Circuits, vol. 49, No. 8, pp. 1702-1714, Aug. 2014.

Westerveld et al., "A 115dB-DR Audio DAC with—61dBFS Out-of-Band Noise," 2015 IEEE International Solid-State Circuits Conference, Session 15, Data-Converter Techniques, 15.3, 2015, Total 3 pages.

Xiao et al., "A Performance-Aware Low-Quiescent Headphone Amplifier in 65-nm CMOS," IEEE Journal of Solid-State Circuits, vol. 52, No. 2, pp. 505-516, Feb. 2017.

Communication dated Dec. 23, 2021 by the European Patent Office in European Patent Application No. 21184004.6.

* cited by examiner

AMPLIFIER

CROSS-REFERENCE TO RELATED APPLICATION

This application is based on and claims priority under 35 U.S.C. § 119 to Korean Patent Application No. 10-2020-0158029, filed on Nov. 23, 2020, in the Korean Intellectual Property Office, the disclosure of which is incorporated by reference herein in its entirety.

BACKGROUND

1. Field

The disclosure relates to an amplifier.

2. Description of the Related Art

An amplifier is mounted on an electronic device or is an independent device that amplifies a voice signal or a bio signal. There is a required noise level and bandwidth depending on an application in which an amplifier is used.

There is a need for an amplifier that operates at a low noise and has a high resolution and a wide bandwidth.

SUMMARY

Provided is an amplifier. Additional aspects will be set forth in part in the description which follows and, in part, will be apparent from the description, or may be learned by practice of the presented embodiments of the disclosure.

Additional aspects will be set forth in part in the description which follows and, in part, will be apparent from the description, or may be learned by practice of the example embodiments of the disclosure.

According to an aspect of the disclosure, there is provided an amplifier comprising: an input circuit configured to convert an input signal into a current; an output circuit comprising at least one switching element and configured to provide an output signal; and a biasing circuit connected to the at least one switching element of the output circuit to form a feedback loop configured to adjust a voltage change of an output end of the input circuit.

The input circuit may be further configured to convert the input signal into a differential input current and output the differential input current.

The biasing circuit may be configured to reduce the voltage change corresponding to the differential input current.

The at least one switching element may comprise a first switching element connected to the output end of the input circuit, the biasing circuit may comprise a first amplification circuit configured to amplify a voltage of the output end of the input circuit, and the first amplification circuit may be connected to the first switching element to form the feedback loop configured to adjust the voltage change of the output end of the input circuit.

The first amplification circuit may be configured to receive a first operating voltage and the voltage of the output end of the input circuit, and bias a first bias voltage of the first switching element based on the first operating voltage and the voltage of the output end of the input circuit.

The first amplification circuit may be configured to increase a transconductance (gm) of the first switching element.

The at least one switching element may further comprise a second switching element connected to the output end of the input circuit, the biasing circuit may comprise a second amplification circuit configured to amplify the voltage of the output end of the input circuit, and the second amplification circuit may be connected to the second switching element to form the feedback loop configured to adjust the voltage change of the output end of the input circuit.

The second amplification circuit may be configured to receive a second operating voltage and the voltage of the output end of the input circuit, and bias a second bias voltage of the second switching element based on the second operating voltage and the voltage of the output end of the input circuit.

The second amplification circuit may be configured to increase a transconductance of the second switching element.

The output circuit may further comprises a capacitor configured to increase a bandwidth of the output signal.

The at least one switching element may comprise: a first switching element and a second switching element each connected to the output end of the input circuit; a third switching element connected in parallel to the first switching element and the second switching element; and a fourth switching element connected to the third switching element, and wherein the capacitor is connected between a node between the third switching element and the fourth switching element and the output end of the output circuit.

The first switching element may comprise an N-channel metal-oxide-semiconductor field effect transistor (NMOS-FET) or a P-channel metal-oxide-semiconductor field effect transistor (PMOSFET), wherein the second switching element comprises a switching element of a type different from a type of the first switching element.

The input circuit, the biasing circuit, and the output circuit may form a first circuit, and the amplifier further may comprise: a second circuit configured to output another output signal having a differential relationship with the output signal.

The second circuit may be configured to convert an another signal input to the second circuit into an another current, and adjust a voltage change corresponding to the converted another current.

Each of the first circuit and the second circuit may comprise two input signals, and each of the first circuit and the second circuit may comprise one output signal.

According to another aspect of the disclosure, there is provided a method of amplifying by an amplifier comprising: converting an input signal received by an input circuit into a current; outputting, by an output circuit including at least one switching element, an output signal; and adjusting a voltage change of an output end of the input circuit by a biasing circuit connected to the at least one switching element of the output circuit in a feedback loop.

According to another aspect of the disclosure, there is provided an amplifier comprising: an input circuit configured to output a first signal based on an input signal; an output circuit including a first switching element, a second switching element, a third switching element and a fourth switching element; and a first biasing circuit including a first amplifier having a first input terminal, a second input terminal and a first output terminal, wherein a gate of the first switching element is connected to the first output terminal of the first amplifier of the first biasing circuit, wherein the first signal is provided at a first node between the first switching element and the second switching element, wherein the first input terminal of the first amplifier is connected to a first bias voltage to receive the first bias voltage as a first input and the second input terminal is connected to the first node to receive the first signal as a second input so as to form a first feedback loop configured to adjust a voltage change of the first signal of the input circuit.

The amplifier may further comprise: a second biasing circuit including a second amplifier having a third input terminal, a fourth input terminal and a second output terminal, wherein a gate of the fourth switching element is connected to the third input terminal of the second amplifier of the second biasing circuit, wherein a second signal output by the input circuit is provided at a second node between the third switching element and the fourth switching element, wherein the third input terminal of the second amplifier is connected to a second bias voltage to receive the second bias voltage as a third input and the fourth input terminal is connected to the second node to receive the second signal as a fourth input so as to form a second feedback loop configured to adjust a voltage change of the second signal of the input circuit.

The first biasing circuit may be configured to reduce the voltage change corresponding to the first signal.

The second biasing circuit may be configured to reduce the voltage change corresponding to the second signal.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
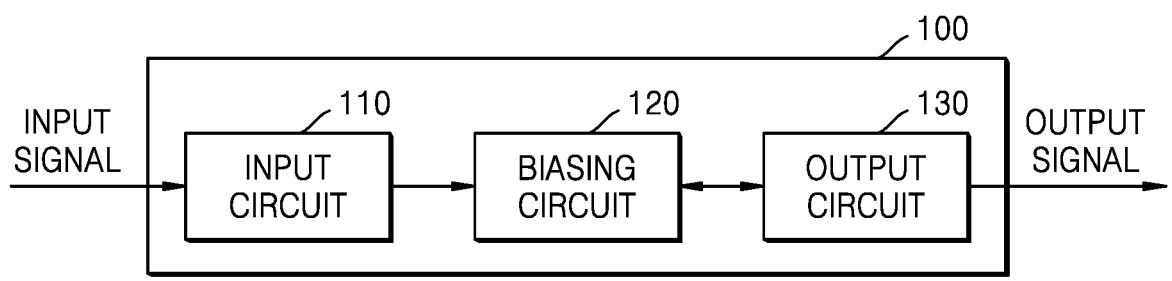
FIG. 1 is a block diagram showing a configuration of an amplifier according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the disclosure are selected based on general terms currently widely used in the art in consideration of functions regarding the disclosure, but the terms may vary according to the intention of those of ordinary skill in the art, precedents, or new technology in the art. Also, some terms may be arbitrarily selected by the Applicant, and in this case, the meaning of the selected terms will be described in the detailed description of the disclosure. Thus, the terms used herein should not be construed based on only the names of the terms but should be construed based on the meaning of the terms together with the description throughout the disclosure.

Throughout the specification, when a portion "includes" an element, unless otherwise described, another element may be further included, rather than the presence of other elements being excluded.

The term used in the example embodiments such as "unit" or "module" indicates a unit for processing at least one function or operation, and may be implemented in hardware or software, or in a combination of hardware and software.

It will be understood that, although the terms "first", "second", etc. may be used herein to describe various elements, these elements should not be limited by these terms. These terms are only used to distinguish one element from another.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

Example embodiments of the disclosure will be described in detail in order to fully convey the scope of the disclosure and enable one of ordinary skill in the art to embody and practice the disclosure. The disclosure may, however, be embodied in many different forms and should not be construed as being limited to the example embodiments set forth herein.

FIG. 1 is a block diagram showing a configuration of an amplifier 100 according to an example embodiment.

Referring to FIG. 1, the amplifier 100 may include an input circuit 110, a biasing circuit 120, and an output circuit 130. In the amplifier 100 shown in FIG. 1, only components related to the example embodiments are shown. Therefore, it is apparent to those skilled in the art that the amplifier 100 may further include other general-purpose components in addition to the components shown in FIG. 1 according to other embodiments.

The amplifier 100 may be a device that increases an input signal at a constant rate and may be implemented in the form of a chip. For example, the amplifier 100 may be implemented in the form of the chip and mounted on various mobile devices such as a mobile phone and a smart speaker. The amplifier 100 may be implemented as an independent device and used in connection with an external device such as a speaker. Also, the amplifier 100 may be a class-AB amplifier.

The input circuit 110 may convert the input signal into a current. The input signal may mean a signal input to the input circuit 110 from the outside. For example, the input signal may be a voltage, but is not limited thereto.

The input circuit 110 may convert a voltage input to the input circuit 110 into a current.

There may be a plurality of input signals. For example, the number of input signals may be two or four, but is not limited thereto. In other words, the amplifier 100 may receive 2 inputs or 4 inputs. The input circuit 110 will be described later in detail with reference to FIG. 2. According to another example embodiment, the number of input signal may be different than two or four.

The biasing circuit 120 may reduce a voltage change of an output end of the input circuit 110. According to an example embodiment, the output end may be the output node of the input circuit 110. The output end of the input circuit 110 may refer to a point at which the converted current is output from the input circuit 110 and is input to the biasing circuit 120. The biasing circuit 120 may reduce the voltage change of the output end of the input circuit 110 and may reduce an output swing of the output end of the input circuit 110.

However, the disclosure is not limited thereto, and as such, according to another example embodiment, the output end of the input circuit 110 may refer to a point at which the converted current is output from the input circuit 110 and is input to a circuit different from the biasing circuit 120. According to another example embodiment, However, the disclosure is not limited thereto, and as such, according to another example embodiment, the output end of the input circuit 110 may refer to a point at which the converted current is output from the input circuit 110 and is input to a circuit different from the biasing circuit 120. As such, the converted current output from the input circuit 110 is input to the biasing circuit 120 through an intermediate circuit.

The output circuit 130 may include at least one switching element for reducing the voltage change of the output end of the input circuit 110 and may provide an output signal. The at least one switching element may reduce the voltage change of the output end of the input circuit 110 and may reduce the output swing of the output end of the input circuit 110.

The switching element may include a switching element such as a bipolar junction transistor (BJT), a metal-oxide-semiconductor field effect transistor (MOSFET), but is not limited to types of the listed switching elements. In addition, the output circuit 130 may mean an output end of the class-AB amplifier. The output circuit 130 will be described later in detail with reference to FIG. 5.

The at least one switching element of the output circuit 130 may be connected to the biasing circuit 120. The biasing circuit 120 may be connected to the at least one switching element to form a feedback loop for reducing the voltage change of the output end of the input circuit 110. The biasing circuit 120 will be described later in detail with reference to FIG. 3.

In the case of designing the amplifier 100, when the output swing of a specific point increases, a nonlinearity of the amplifier 100 increases and a distortion increases, and thus it is desirable to reduce the output swing of the specific point when designing the amplifier 100. For instance, when the voltage change at a specific point in the amplifier increases, a nonlinearity of the amplifier 100 increases and a distortion increases. The amplifier 100 according to the disclosure may include the biasing circuit 120 for reducing the voltage change of the output end of the input circuit 110, thereby reducing the output swing of the output end of the input circuit 110. Accordingly, the voltage of the output end may be stabilized, and the linearity of the amplifier 100 may increase.

Figure 2:
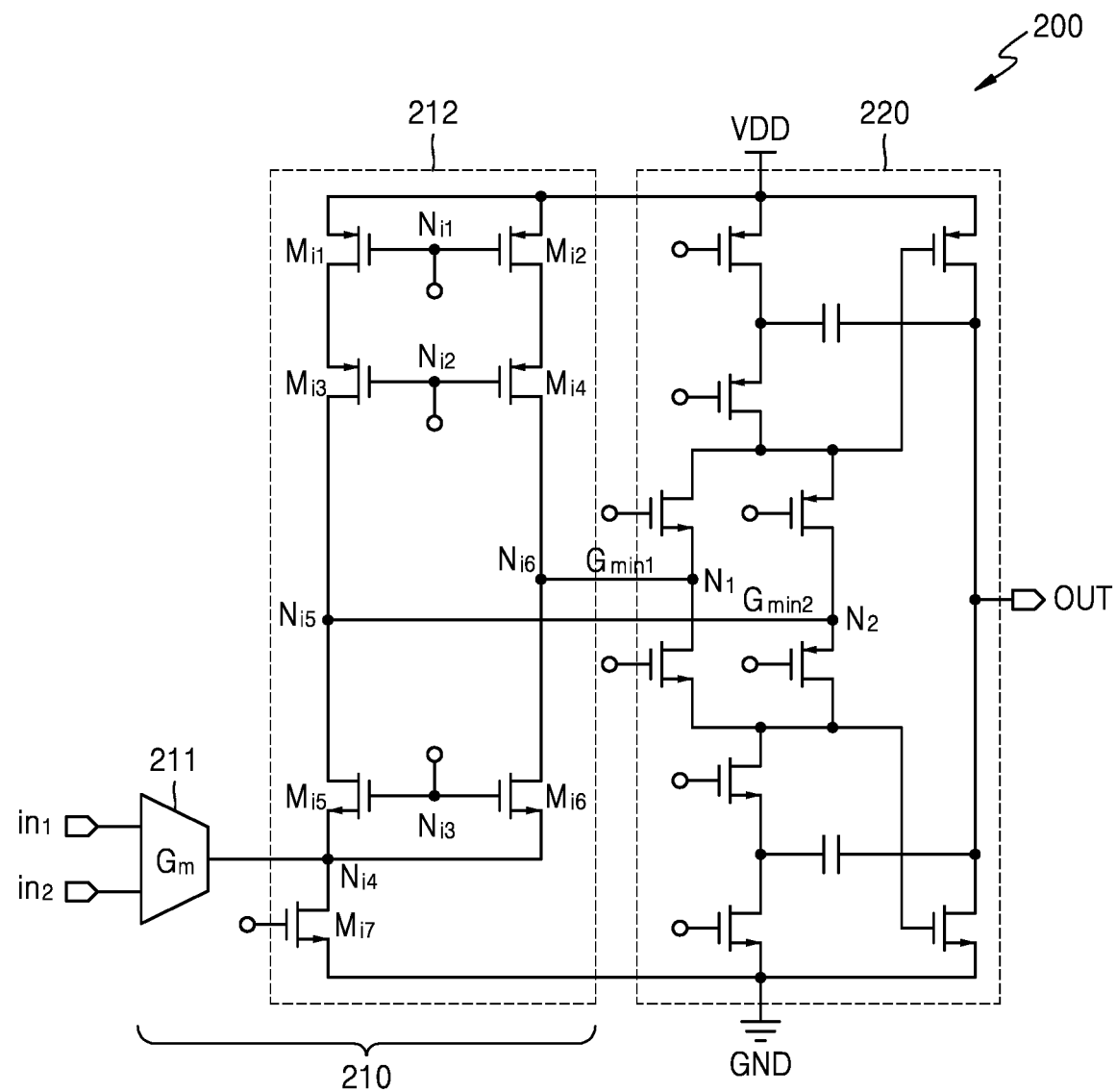
FIG. 2 is a diagram illustrating an amplifier including an input circuit according to an example embodiment.

FIG. 2 is a diagram illustrating an amplifier 200 according to an example embodiment.

Referring to FIG. 2, the amplifier 200 may include an input circuit 210 and an output circuit 220. The amplifier 200, the input circuit 210, and the output circuit 220 of FIG. 2 may respectively correspond to the amplifier 100, the input circuit 110, and the output circuit 130 of FIG. 1, and thus redundant descriptions are omitted. Meanwhile, in FIG. 2, the biasing circuit 120 of FIG. 1 is omitted, but the disclosure is not limited thereto. As such according to another example embodiment, the biasing circuit 120 may be added the structure in FIG. 1. According to an example embodiment, the unlabeled elements of the output circuit 220 may correspond to the respective labeled elements in the output circuit 520 in FIG. 5.

The input circuit 210 may include an input module 211. According to an example embodiment, the input module 211 may convert an input signal into a current. According to an example embodiment, the input module 211 may be a transconductor, a Gm cell, or the like that converts a voltage into a current. According to an example embodiment, the input signal may include a first input signal $in_1$ and a second input signal $in_2$. According to an example embodiment, each of the first input signal $in_1$ and the second input signal in may be input to the input module 211 and converted into the current, and the converted current may be provided to the output circuit 220 and a biasing circuit.

The first input signal $in_1$ and the second input signal in may be differential signals. For example, the input module 211 may convert differential voltages by the first input signal $in_1$ and the second input signal in into the current. The input module 211 may control an output current based on transconductance ($g_m$).

The input module 211 may include a switching element. For example, the input module 211 may be configured as one or more N-channel metal oxide semiconductor (NMOS) transistors. As another example, the input module 211 may be configured as one or more P-channel metal oxide semiconductor (PMOS) transistors. As another example, the input module 211 may be configured as a combination of the NMOS and PMOS transistors. However, the disclosure is not limited thereto, and as such, according to another example embodiment, an internal structure of the input module 211 may be constructed as necessary.

The input circuit 210 may further include a correction circuit 212. The correction circuit 212 may provide current to the output circuit 220 or the biasing circuit. According to another example embodiment, the correction circuit 212 may provide current to the output circuit 220 and the biasing circuit. Each of the first input signal $in_1$ and the second input signal $in_2$ may be input to the input module 211 and converted into the current, and the converted current may be provided to the correction circuit 212.

The correction circuit 212 may correct a transconductance of the switching element of the input module 211. For example, when the first input signal $in_1$ is applied as a gate voltage of one of the PMOS transistors of the input module 211, and the second input signal $in_2$ is applied as a gate voltage of another of the PMOS transistors of the input module 211, the correction circuit 212 may increase or decrease the transconductance of the PMOS transistors.

According to an example embodiment, the input circuit 210 may convert and output an input signal into a differential input current. The differential input current may include a first signal $G_{min1}$ and a second signal $G_{min2}$, and the first signal $G_{min1}$ and the second signal $G_{min2}$ may refer to currents in a differential relationship with each other. The first signal $G_{min1}$ and the second signal $G_{min2}$ may be provided to the output circuit 220 and the biasing circuit.

The differential input current may refer to two currents having a phase difference of 180° degrees. In other words, the differential input current may be a current having an opposite polarity, or a current in which a same amount decreases and increases from an arbitrary reference current. For example, the differential input current may mean the first signal $G_{min1}$ and the second signal $G_{min2}$ within the range of −3 µA to 3 µA with respect to 0 µA. In addition, the differential input current may mean the second signal $G_{min2}$ and the first signal $G_{min1}$ within the range of 1 µA to 3 µA with respect to 2 µA. As another example, the differential input current may mean the first signal $G_{min1}$ and the second signal $G_{min2}$ swinging within the range of −3 µA to 3 µA with respect to 0 µA. In addition, the differential input current may mean the second signal $G_{min2}$ and the first signal $G_{min1}$ swinging within the range of 1 µA to 3 µA with respect to 2 µA.

The correction circuit 212 may include switching elements $M_{i1}$, $M_{i2}$, $M_{i3}$, $M_{i4}$, $M_{i5}$, $M_{i6}$, and $M_{i7}$. The switching element Mil may be connected to a power voltage VDD. The switching element $M_{i2}$ may be connected to the power voltage VDD. The switching element $M_{i3}$ may be connected to the switching element Mil. The switching element $M_{i4}$ may be connected to the switching element $M_{i2}$. The switching element Mil and the switching element $M_{i2}$ may be connected to each other. The switching element $M_{i3}$ and the switching element $M_{i4}$ may be connected to each other.

The switching element Mil and the switching element $M_{i3}$ may form a cascode, and the switching element $M_{i2}$ and the switching element $M_{i4}$ may form a cascode. A proximity effect may be overcome by using several switching elements $M_{i1}$, $M_{i2}$, $M_{i3}$, and $M_{i4}$ in the correction circuit 212.

The switching element $M_{i5}$ may be connected to the switching element $M_{i3}$. The switching element $M_{i6}$ may be connected to the switching element $M_{i4}$. The switching element $M_{i7}$ may be connected to the switching element $M_{i5}$. The switching element $M_{i5}$ and the switching element $M_{i6}$ may be connected to each other. The switching element $M_{i5}$ and the switching element $M_{i6}$ may be connected to the input module 211. A node $N_{i4}$ between the switching element $M_{i5}$, the switching element $M_{i6}$ and the switching element Mil may be connected to the input module 211. The node $N_{i4}$ may be connected to the input module 211 and thus the correction circuit 212 may receive the converted current from the input module 211.

A node $N_{i5}$ between the switching element $M_{i3}$ and the switching element $M_{i5}$ may be connected to the output circuit 220. A node $N_{i6}$ between the switching element $M_{i4}$ and the switching element $M_{i5}$ may be connected to the output circuit 220. The input circuit 210 may be connected to the output circuit 220, and thus the first signal $G_{min1}$ and the second signal $G_{min2}$ may be transmitted to the output circuit 220. For example, the first signal $G_{min1}$ may pass through the node $N_{i6}$, and the second signal $G_{min2}$ may pass through the node $N_{i5}$.

The correction circuit 212 may include the NMOS transistors $M_{i5}$, $M_{i6}$, and Wand the PMOS transistors $M_{i1}$, $M_{i2}$, $M_{i3}$, and $M_{i4}$. A source of the switching element Mil and a source of the switching element $M_{i2}$ may be connected to the power voltage VDD. A gate of the switching element Mil and a gate of the switching element $M_{i2}$ may be connected to each other. A source of the switching element $M_{i3}$ may be connected to a drain of the switching element Mil. A source of the switching element $M_{i4}$ may be connected to a drain of the switching element $M_{i2}$. A gate of the switching element $M_{i3}$ and a gate of the switching element $M_{i4}$ may be connected to each other. The switching element Mil and the switching element $M_{i3}$ may form a cascode, and thus the same type of switching element may be used. In addition, the switching element $M_{i2}$ and the switching element $M_{i4}$ may form a cascode, and thus the same type of switching element may be used.

A drain of the switching element $M_{i5}$ may be connected to a drain of the switching element $M_{i3}$, and a drain of the switching element $M_{i6}$ may be connected to a drain of the switching element $M_{i4}$. A gate of the switching element $M_{i5}$ and a gate of the switching element $M_{i6}$ may be connected to each other. A drain of the switching element $M_{i7}$ may be connected to a source of the switching element $M_{i5}$, and a source of the switching element $M_{i7}$ may be connected to a ground.

A node $N_{i4}$ between the source of the switching element $M_{i5}$ and the drain of the switching element $M_{i7}$ may be connected to the output end of the input module 211. A source of the switching element $M_{i6}$ may be connected to the output end of the input module 211. A node Nis between the drain of the switching element $M_{i3}$ and the drain of the switching element $M_{i5}$ may be connected to the output circuit 220. A node Nis between the drain of the switching element $M_{i4}$ and the drain of the switching element $M_{i5}$ may be connected to the output circuit 220.

Figure 3:
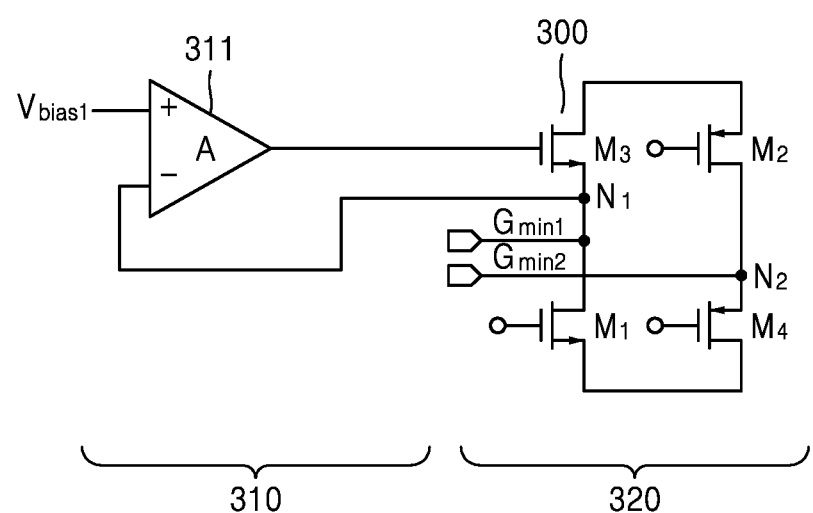
FIG. 3 is a diagram illustrating an operation of an amplifier including a biasing circuit according to an example embodiment.

FIG. 3 is a diagram illustrating an operation of an amplifier 300 including a biasing circuit 310 according to an example embodiment.

Referring to FIG. 3, the amplifier 300 may include the biasing circuit 310 and an output circuit 320. The amplifier 300 and the output circuit 320 of FIG. 3 respectively correspond to the amplifier 200 and the output circuit 220 of FIG. 2, and the biasing circuit 310 of FIG. 3 corresponds to the biasing circuit 120 of FIG. 1, and thus the redundant description is omitted. Although the input circuit 210 and some elements of the output circuit 220 from FIG. 2 are omitted in the illustration in FIG. 3, they may be added. The first signal $G_{min1}$ and the second signal $G_{min2}$ may refer to current converted from the input circuit.

The output circuit 320 may include a first switching element $M_3$. The first switching element $M_3$ may be connected to an output end of the input circuit 210 and may reduce a voltage change of a node $N_1$ between the first switching element $M_3$ and the output end of the input circuit 210. The first switching element $M_3$ may be stacked on a switching element $M_1$. The switching element $M_1$ and the first switching element $M_3$ may form a cascode, and an output swing of the node $N_1$ may be reduced due to a cascode shielding property.

The biasing circuit 310 may include a first amplification circuit 311. The first amplification circuit 311 may amplify a voltage of the output end of the input circuit. For example, the first amplification circuit 311 may amplify a voltage of the node $N_1$ connected to the output end of the input circuit 210.

The first amplification circuit 311 may be connected to the first switching element $M_3$ to form a feedback loop for reducing the voltage change of the output end of the input circuit 210. The feedback loop connected to the first amplification circuit 311 and the first switching element $M_3$ may reduce the voltage change of the node $N_1$ between the first switching element $M_3$ and the output end of the input circuit 210.

The first amplifier circuit 311 may amplify the voltage of the node $N_1$ by using the voltage of the node $N_1$ as an input. A current flowing through the first switching element $M_3$ may change based on the amplified voltage of the node $N_1$. The voltage of the node $N_1$ may change according to a change in the current flowing through the first switching element $M_3$. The voltage of the node $N_1$ may have a reduced voltage change due to the feedback loop.

An input end of the first amplifier circuit 311 may be connected to the node $N_1$ between the first switching element $M_3$ and the output end of the input circuit 210, and the output end of the first amplifier circuit 311 and the first switching element $M_3$ may be connected to form the feedback loop. For example, when the first switching element $M_3$ is an NMOS, the input end of the first amplification circuit 311 and the source of the first switching element $M_3$ are connected, and the output end of the first amplification circuit 311 and the gate of the first switching element $M_3$ may be connected to form the feedback loop.

The first amplifier circuit 311 may amplify the voltage of the node $N_1$ by using the voltage of the node $N_1$ as an input. The current flowing from the drain to the source of the first switching element $M_3$ may change by the amplified voltage of the node $N_1$. Accordingly, the voltage of the source of the first switching element $M_3$ may change. The feedback loop may reduce a voltage change of the source of the first switching element $M_3$.

The first amplification circuit 311 may increase the transconductance of the first switching element $M_3$. The feedback loop connected to the first amplification circuit 311 and the first switching element $M_3$ may increase the transconductance of the first switching element $M_3$. The feedback loop may be formed to be a transconductance ($g_m$) boosting circuit.

The transconductance ($g_m$) boosting circuit may be of the same or similar form as a gain boosting circuit. The transconductance ($g_m$) boosting circuit may reduce an output impedance. The feedback loop may be a negative feedback loop, and a voltage inside the feedback loop may be stabilized. According to an example embodiment, even though a current is input into the feedback loop, the voltage in the feedback loop may be stabilized, which may correspond to a current change but no voltage change. Thus, the output impedance may be reduced. When the output impedance is reduced, an increased current change occurs at the same voltage change, which may mean that the transconductance increases. The transconductance may increase to a range. According to an example embodiment, the range may be a preset range, which may be a range designated by a user, a range required when designing the amplifier 300, etc.

The feedback loop may increase the transconductance of the first switching element $M_3$. The increase in the transconductance may result in a reduction in the voltage change of the node $N_1$, and a total harmonic distortion (THD) may be reduced. When the THD is reduced, a linearity of the amplifier 300 may be improved and a distortion may be reduced.

The first amplification circuit 311 may receive a first operating voltage $V_{bias1}$ and a voltage of the output end of the input circuit 210. For example, a positive input end of the first amplification circuit 311 may receive the first operating voltage $V_{bias1}$, and a negative input end may receive the voltage of the node $N_1$ between the first switching element $M_3$ and the output end of the input circuit 210, but the disclosure is not limited thereto. The first operating voltage $V_{bias1}$ may be a voltage applied to the first amplification circuit 311 so as to set an operating point of the first amplification circuit 311. The first operating voltage $V_{bias1}$ may be a DC voltage or a common mode voltage. The first operating voltage $V_{bias1}$ may be applied from outside or inside the amplifier 300.

The first amplification circuit 311 may bias a first bias voltage of the first switching element $M_3$ based on the first operating voltage $V_{bias1}$ and the voltage of the output end of the input circuit 210. The first bias voltage may mean a voltage applied to the first switching element $M_3$ to set the operating point of the first switching element $M_3$. The first bias voltage may be the DC voltage. When the first switching element $M_3$ is an NMOS transistor, the first bias voltage may be determined according to a gate voltage of the first switching element $M_3$. Because an output of the first amplification circuit 311 and the gate of the first switching element $M_3$ are connected to each other in the feedback loop, the first bias voltage may be biased by the feedback loop.

The first amplifier circuit 311 may amplify the voltage of the node $N_1$ by using the first operating voltage $V_{bias1}$ and the voltage of the node $N_1$ as inputs. The current flowing through the first switching element $M_3$ may change by the amplified voltage of the node $N_1$. The voltage of the node $N_1$ may change due to a change in the current flowing through the first switching element $M_3$. The voltage change of the node $N_1$ due to the current change may be reduced by the feedback loop and the first operating voltage $V_{bias1}$. For example, the voltage of the node $N_1$ may be biased to the first operating voltage $V_{bias1}$ by the feedback loop.

A stability problem of switching elements may arise when the first bias voltage of the first switching element $M_3$ is biased in the form of a cascode by stacking several diode type switching elements between a power voltage or ground in a single power source and both power sources. When a minor change in the power voltage occurs, operating points of the switching elements may change, and the switching elements may be sensitive to a process voltage temperature (PVT). The first bias voltage of the first switching element $M_3$ may be easily set through the first operating voltage $V_{bias1}$ and the feedback loop that is a negative feedback. In addition, the first switching element $M_3$ may be insensitive to PVT because the first bias voltage may be easily set.

The biasing circuit 310 may reduce a voltage change provided from a differential input current. The voltage provided from the differential input current may mean a voltage provided from the differential input current to the input of the first amplification circuit 311. The first amplification circuit 311 may amplify the voltage provided from the first signal $G_{min1}$ by using the voltage of the node $N_1$ that is the voltage provided from the first signal $G_{min1}$ as an input. The current flowing through the first switching element $M_3$ may change by the voltage provided from the amplified first signal $G_{min1}$. The voltage change may be reduced by the feedback loop and the first operating voltage $V_{bias1}$ in the voltage provided from the first signal $G_{min1}$ due to the current change. In other words, the voltage change of the node $N_1$ which is the voltage provided from the first signal $G_{min1}$ may be reduced.

According to an example embodiment, the output circuit 320 may include switching elements $M_2$ and $M_4$ and the connection of the gates of the switching elements $M_1$, $M_2$ and $M_4$ may be connected to a bias voltage applied to each of switching elements so as to set an operating point of each of the switching elements.

Figure 4:
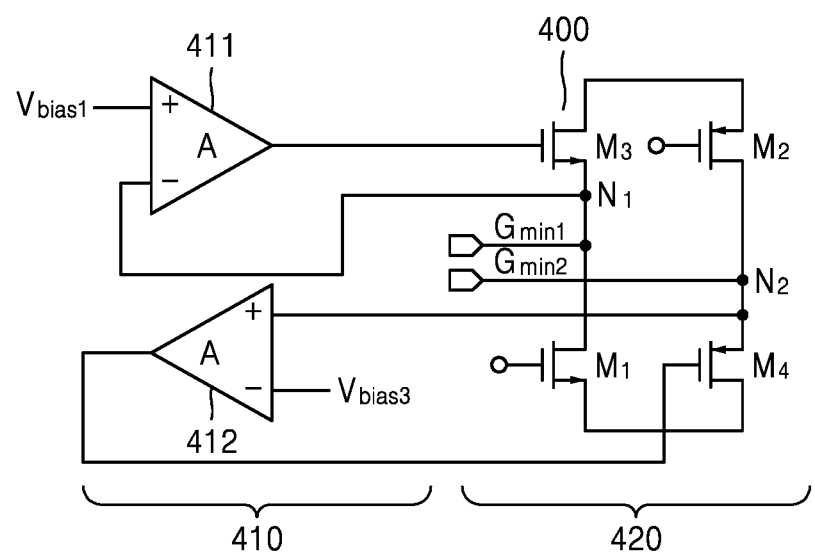
FIG. 4 is a diagram illustrating an amplifier including a first amplification circuit and a second amplification circuit according to an example embodiment.

FIG. 4 is a diagram illustrating an amplifier 400 including a first amplification circuit 411 and a second amplification circuit 412 according to an example embodiment.

Referring to FIG. 4, the amplifier 400 may include a biasing circuit 410 and an output circuit 420. The biasing circuit 410 may include the first amplification circuit 411 and the second amplification circuit 412. The amplifier 400, the biasing circuit 410, the output circuit 420, and the first amplification circuit 411 of FIG. 4 respectively correspond to the amplifier 300, the biasing circuit 310, the output circuit 320, and the first amplification circuit 311 of FIG. 3, and thus redundant descriptions are omitted. Although the input circuit 210 and some elements of the output circuit 220 in FIG. 2 are omitted in FIG. 4, they may be added. The first signal $G_{min1}$ and the second signal $G_{min2}$ may refer to current converted from the input circuit 210.

The output circuit 420 may include a second switching element $M_4$. The second switching element $M_4$ may be connected to an output end of the input circuit 210, and may reduce a voltage change of a node $N_2$ between the second switching element $M_4$ and the output end of the input circuit 210. The switching element $M_2$ and the second switching element $M_4$ may form a cascode. An output swing of the node $N_2$ may be reduced due to a cascode shielding property.

The first switching element $M_3$ and the second switching element $M_4$ may be different types of switching elements. For example, when the first switching element $M_3$ is an NMOS transistor, the second switching element $M_4$ may be a PMOS transistor. In addition, when the first switching element $M_3$ is a PMOS transistor, the second switching element $M_4$ may be an NMOS transistor, but is not limited thereto.

The biasing circuit 410 may include a second amplification circuit 412. The second amplification circuit 412 may amplify a voltage of the output end of the input circuit 210. For example, the second amplification circuit 412 may amplify the voltage of the node $N_2$ connected to the second amplification circuit 412.

The first amplification circuit 411 and the second amplification circuit 412 may be different from each other. The types of switching elements included in the first amplification circuit 411 and the second amplification circuit 412 may be different from each other. In addition, a connection relationship between the switching elements included in the first amplification circuit 411 and the second amplification circuit 412 may be different from each other. For example, when the first amplification circuit 411 includes an NMOS transistor and a PMOS transistor, a switching element corresponding to the NMOS transistor of the first amplification circuit 411 may change from the second amplification circuit 412 to the PMOS transistor. A switching element corresponding to the PMOS transistor of the first amplification circuit 411 may change to the NMOS transistor in the second amplification circuit 412.

The first amplification circuit 411 may be connected to the first switching element $M_3$ to form a feedback loop for reducing the voltage change of the output end of the input circuit 210. The second amplification circuit 412 may be connected to the second switching element $M_4$ to form the feedback loop for reducing the voltage change of the output end of the input circuit 210. A feedback loop connected to the second amplification circuit 412 and the second switching element $M_4$ may reduce a voltage change of the node $N_2$ between the second switching element $M_4$ and the output end of the input circuit 210.

The second amplification circuit 412 may amplify the voltage of the node $N_2$ by using the voltage of the node $N_2$ as an input. A current flowing through the second switching element $M_4$ may change based on the amplified voltage of the node $N_2$. The voltage of the node $N_2$ may change according to a change in the current flowing through the second switching element $M_4$. The voltage change of the node $N_2$ may be reduced based on the feedback loop connected to the second amplification circuit 412 and the second switching element $M_4$.

The feedback loop connected to the first switching element $M_3$ and the feedback loop connected to the second switching element $M_4$ may reduce voltage changes of the node $N_1$ and the node $N_2$, respectively.

An input end of the second amplification circuit 412 may be connected to the node $N_2$ between the second switching element $M_4$ and the output end of the input circuit 210, and an output end of the second amplification circuit 412 and the second switching element $M_4$ may be connected to form the feedback loop. For example, when the second switching element $M_4$ is the PMOS transistor, the input end of the second amplification circuit 412 and a source of the second switching element $M_4$ may be connected to each other, and the output end of the second amplification circuit 412 and a gate of the second switching element $M_4$ may be connected to form the feedback loop. The feedback loop connected to the second switching element $M_4$ may reduce a voltage change of the source of the second switching element $M_4$.

The second amplification circuit 412 may increase a transconductance of the second switching element $M_4$. The feedback loop connected to the second switching element $M_4$ may increase the transconductance of the second switching element $M_4$. The feedback loop connected to the second switching element $M_4$ may be formed to be a transconductance ($g_m$) boosting circuit.

The feedback loop connected to the second switching element $M_4$ may increase the transconductance of the second switching element $M_4$, and the feedback loop connected to the first switching element $M_3$ may increase the transconductance of the first switching element $M_3$.

The second amplification circuit 412 may receive a second operating voltage $V_{bias3}$ and a voltage of an output end of the input circuit 210. For example, a positive input end of the second amplification circuit 412 may receive the voltage of the node $N_2$ between the second switching element $M_4$ and the output end of the input circuit 210, and a negative input end may receive the second operating voltage $V_{bias3}$, but the disclosure is not limited thereto. The second operating voltage $V_{bias3}$ may be a voltage applied to the second amplification circuit 412 so as to set an operating point of the second amplification circuit 412. The second operating voltage $V_{bias3}$ may be a DC voltage or a common mode voltage. The second operating voltage $V_{bias3}$ may be applied from outside or inside the amplifier 400. The second operating voltage $V_{bias3}$ and the first operating voltage $V_{bias1}$ may be the same or may have a differential relationship, but are not limited thereto. For example, both the first operating voltage $V_{bias1}$ and the second operating voltage $V_{bias3}$ may be 3 mV. As another example, the first operating voltage $V_{bias1}$ and the second operating voltage $V_{bias3}$ may be +3 mV and −3 mV, respectively.

The second amplification circuit 412 may bias a second bias voltage of the second switching element $M_4$ based on the second operating voltage $V_{bias3}$ and the voltage of the output end of the input circuit. The second bias voltage may mean a voltage applied to the second switching element $M_4$ so as to set the operating point of the second switching element $M_4$. The second bias voltage may be a DC voltage. When the second switching element $M_4$ is a PMOS transistor, the second bias voltage may be determined according to a gate voltage of the second switching element $M_4$. Because an output of the second amplification circuit 412 and a gate of the second switching element $M_4$ are connected to each other, the second bias voltage may be biased by the feedback loop connected to the second switching element $M_4$.

The second amplification circuit 412 may amplify the voltage of the node $N_2$ by using the second operating voltage $V_{bias3}$ and the voltage of the node $N_2$ as inputs. The current flowing through the second switching element $M_4$ may change based on the amplified voltage of the node $N_2$. The voltage of the node $N_2$ may change according to a change in the current flowing through the second switching element $M_4$. The voltage change of the node $N_2$ due to the current change may be reduced by the feedback loop connected to the second switching element $M_4$ and the second operating voltage $V_{bias3}$. For example, the voltage of the node $N_2$ may be biased to the second operating voltage $V_{bias3}$ based on the feedback loop connected to the second switching element $M_4$.

According to an example embodiment, the connection of the gates of the switching elements $M_1$ and $M_2$ may be connected to a bias voltage applied to each of switching elements so as to set an operating point of each of the switching elements.

Figure 5:
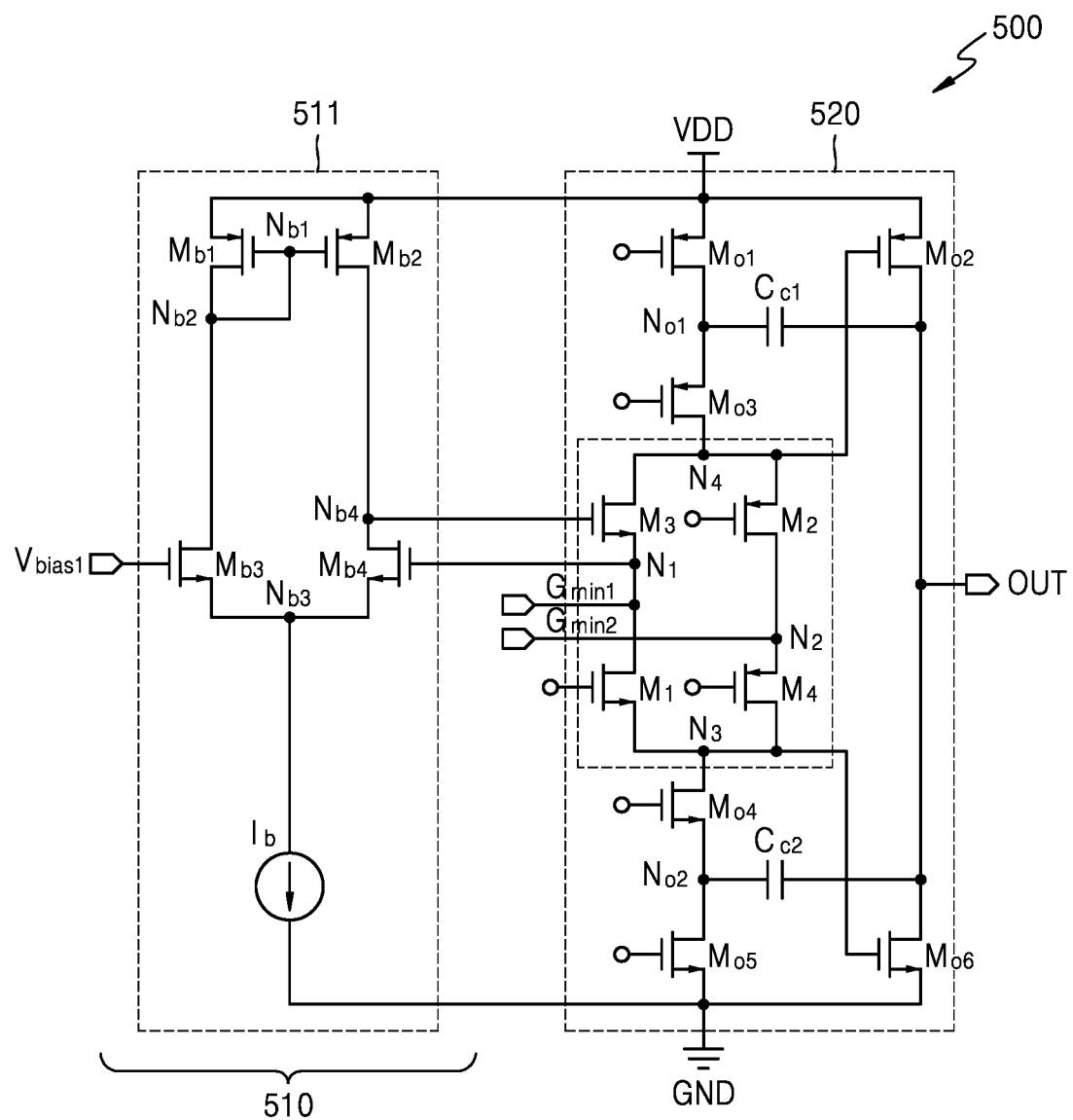
FIG. 5 is a diagram illustrating an example of a circuit diagram of an amplifier according to an example embodiment.

FIG. 5 is a diagram illustrating an example of a circuit diagram of an amplifier 500 according to an example embodiment.

Referring to FIG. 5, the amplifier 500 may include a biasing circuit 510 and an output circuit 520. The biasing circuit 510 may include a first amplification circuit 511. The amplifier 500, the biasing circuit 510, the output circuit 520, and the first amplification circuit 511 of FIG. 5 respectively correspond to the amplifier 400, the biasing circuit 410, and the output circuit 420, and the first amplification circuit 411 of FIG. 4, and thus redundant descriptions are omitted. Although the input circuit 210 of FIG. 2 is omitted in the illustration in FIG. 5, it may be added. The first signal $G_{min1}$ and the second signal $G_{min2}$ may mean current converted from the input circuit 210.

The first amplification circuit 511 may include switching elements $M_{b1}$, $M_{b2}$, $M_{b3}$, and $M_{b4}$ and a current source $I_b$. The switching element $M_{b1}$ may be connected to the power voltage VDD. The switching element $M_{b2}$ may be connected to the power voltage VDD. The switching element $M_{b1}$ and the switching element $M_{b2}$ may be connected to each other. The switching element $M_{b3}$ may be connected to the switching element $M_{b1}$. A node $N_{b1}$ between the switching element $M_{b1}$ and the switching element $M_{b2}$ may be connected to a node $N_{b2}$ between the switching element $M_{b1}$ and the switching element $M_{b3}$. The switching element $M_{b4}$ may be connected to the switching element $M_{b2}$. The switching element $M_{b1}$ and the switching element $M_{b2}$ are current mirrors and may serve as current sources.

The switching element $M_{b3}$ may be connected to the first operating voltage $V_{bias1}$. The switching element $M_{b4}$ may be connected to the node $N_1$ between an output end of the first signal $G_{min1}$ and the first switching element $M_3$. A node $N_{b4}$ between the switching element $M_{b2}$ and the switching element $M_{b4}$ may be connected to the first switching element $M_3$ to form a feedback loop. The switching element $M_{b3}$ may amplify the first operating voltage $V_{bias1}$. The switching element $M_{b4}$ may amplify a voltage of an output end of the first signal $G_{min1}$.

The current source $I_b$ may be connected between a node $N_{b3}$ between the switching element $M_{b3}$ and the switching element $M_{b4}$ and a ground GND. The current source $I_b$ may provide a bias current $I_b$ to the first amplification circuit 511 and the output circuit 520.

The first amplification circuit 511 may include NMOS transistors $M_{b3}$ and $M_{b4}$ and PMOS transistors $M_{b1}$ and $M_{b2}$. A source of the switching element $M_{b1}$ and a source of the switching element $M_{b2}$ may be connected to the power voltage VDD. A gate of the switching element $M_{b1}$ and a gate of the switching element $M_{b2}$ may be connected to each other. The gate of the switching element $M_{b1}$ may be connected to a drain of the switching element $M_{b1}$. A drain of the switching element $M_{b3}$ may be connected to the drain of the switching element $M_{b1}$. A gate of the switching element $M_{b3}$ may be connected to the first operating voltage $V_{bias1}$, and a source of the switching element $M_{b3}$ may be connected to the current source $I_b$. A drain of the switching element $M_{b4}$ may be connected to a drain of the switching element $M_{b2}$, and a source of the switching element $M_{b4}$ may be connected to the current source $I_b$. A drain of the switching element $M_{b4}$ may be connected to the first switching element $M_3$, and a gate of the switching element $M_{b4}$ may be connected to the node $N_1$ to form the feedback loop. The current source $I_b$ may be connected to the source of the switching element $M_{b3}$ and the source of the switching element $M_{b4}$, and may be connected to the ground GND.

The output circuit 520 may include the first switching element $M_3$, the second switching element $M_4$, a third switching element $M_{o3}$, a fourth switching element $M_{o1}$, and switching elements $M_1$, $M_2$, $M_{o2}$, $M_{o4}$, $M_{o5}$, and $M_{o6}$. The fourth switching element $M_{o1}$ may be connected to the power voltage VDD. The third switching element $M_{o3}$ may be connected to the fourth switching element $M_{o1}$. The switching element $M_{o2}$ may be connected to the power voltage VDD. The switching element $M_{o2}$ may be connected to an output signal OUT. The switching element $M_{o2}$ may be connected to the fourth switching element $M_{o1}$ and the third switching element $M_{o3}$. The switching element $M_{o2}$ may compensate for a frequency characteristic of the amplifier 500.

The first switching element $M_3$ may be connected in parallel with the third switching element $M_{o3}$. The switching element $M_2$ may be connected in parallel with the third switching element $M_{o3}$ and the first switching element $M_3$. The switching element $M_1$ may be connected to the first switching element $M_3$, and the second switching element $M_4$ may be connected to the switching element $M_2$. The switching element $M_1$ and the first switching element $M_3$ may form a cascode, and the switching element $M_2$ and the second switching element $M_4$ may form a cascode. The cascade may be formed such that output swings of the node $N_1$ between the switching element $M_1$ and the first switching element $M_3$ and the node $N_2$ between the switching element $M_2$ and the second switching element $M_4$ may be reduced.

The switching element $M_{o4}$ may be connected to the switching element $M_1$ in parallel, and may be connected to the second switching element $M_4$ in parallel. One end of the switching element $M_{o5}$ may be connected to the switching element $M_{o4}$, and the other end of the switching element $M_{o5}$ may be connected to the ground GND. The switching element $M_{o6}$ may be connected to a node $N_3$ between the second switching element $M_4$ and the switching element $M_1$. The switching element $M_{o6}$ may be connected to the ground GND. The switching element $M_{o6}$ may be connected to the output signal OUT. The switching element $M_{o6}$ may compensate for a frequency characteristic of the amplifier 500.

The node $N_1$ between the first switching element $M_3$ and the switching element $M_1$ may be connected to the first signal $G_{min1}$. The node $N_2$ between the second switching element $M_4$ and the switching element $M_2$ may be connected to the second signal $G_{min2}$.

The output circuit 520 may include NMOS transistors $M_1$, $M_3$, $M_{o4}$, $M_{o5}$, and $M_{o6}$ and PMOS transistors $M_2$, $M_4$, $M_{o1}$, $M_{o2}$, and $M_{o3}$. A source of the fourth switching element $M_{o1}$ may be connected to the power voltage VDD, and a source of the third switching element $M_{o3}$ may be connected to a drain of the fourth switching element Mot A source of the switching element $M_{o2}$ may be connected to the power voltage VDD. A gate of the switching element $M_{o2}$ may be connected to a drain of the third switching element $M_{o3}$, and a drain of the switching element $M_{o2}$ may be connected to the output signal OUT. The switching element $M_{o2}$ may be connected to the output signal OUT to compensate for the frequency characteristic of the amplifier 500.

The drain of the first switching element $M_3$ may be connected to the drain of the third switching element $M_{o3}$, and the source of the switching element $M_2$ may be connected to the drain of the third switching element Mos. The drain of the switching element $M_1$ may be connected to the source of the first switching element $M_3$, and the source of the first switching element $M_3$ and the drain of the switching element $M_1$ may be connected to the first signal $G_{min1}$. The source of the second switching element $M_4$ may be connected to the drain of the switching element $M_2$, and the source of the second switching element $M_4$ and the drain of the switching element $M_2$ may be connected to the second signal $G_{min2}$. The first switching element $M_3$, the second switching element $M_4$, the switching element $M_1$, and the switching element $M_2$ may form a mesh structure. The mesh structure may reduce a voltage change of the source of a first switching element $M_3$. Also, the mesh structure may reduce a voltage change of the source of the second switching element $M_4$.

The drain of the switching element $M_{o4}$ may be connected to the source of the switching element $M_1$ and the drain of the second switching element $M_4$. The drain of the switching element $M_{o5}$ may be connected to the source of the switching element $M_{o4}$, and the source of the switching element $M_{o5}$ may be connected to the ground GND. The drain of the switching element $M_{o6}$ is connected to the output signal OUT, the gate of the switching element $M_{o6}$ may be connected to the drain of the second switching element $M_4$, and the source of the switching element $M_{o6}$ may be connected to the ground GND. The switching element $M_{o6}$ may be connected to the output signal OUT, thereby compensating for the frequency characteristic of the amplifier 500.

A gate of the first switching element $M_3$ may be connected to the first amplification circuit 511 and the node $N_1$ may be connected to the first amplification circuit 511 to form the feedback loop. According to an example embodiment the connection of the gates of the fourth switching element $M_{o1}$, the third switching element $M_{o3}$, and the switching elements $M_1$, $M_2$, $M_{o4}$, and $M_{o5}$ may be connected to a bias voltage applied to each of switching elements so as to set an operating point of each of the switching elements. However, the disclosure is not limited thereto.

The source of the first switching element $M_3$ may be connected to the input end of the first amplification circuit 511, and the gate of the first switching element $M_3$ may be connected to the output end of the first amplification circuit 511 to form the feedback loop. The feedback loop connected to the first switching element $M_3$ may bias a first bias voltage of the first switching element $M_3$ and reduce a voltage change applied to the source of the first switching element $M_3$.

In the output circuit 520, a gate of the second switching element $M_4$ may be connected to an output end of a second amplification circuit which is a circuit of a different type from the first amplification circuit 511 to form the feedback loop. The feedback loop connected to the second switching element $M_4$ may bias a second bias voltage of the second switching element $M_4$ and reduce a voltage change applied to the source of the second switching element $M_4$.

The output circuit 520 may further include capacitors $C_{c1}$ and $C_{c2}$ that increase a bandwidth of the output signal OUT. The capacitors $C_{c1}$ and $C_{c2}$ may be used as compensation capacitors. The capacitor $C_{c1}$ may be connected between the node No1 between the third switching element $M_{o3}$ and the fourth switching element $M_{o1}$ and the output end of the output circuit. The third switching element $M_{o3}$ may be connected in parallel to the first switching element $M_3$ and the second switching element $M_4$. The third switching element $M_{o3}$ may be connected in parallel to the switching element $M_1$ and the switching element $M_2$. In addition, the third switching element $M_{o3}$ may be connected to the capacitor Col. The fourth switching element $M_{o1}$ may be connected to the third switching element $M_{o3}$ and the switching element $M_{o2}$. Further, the fourth switching element $M_{o1}$ may be connected to the capacitor $C_{c1}$.

When the third switching element $M_{o3}$ and the fourth switching element $M_{o1}$ are PMOS transistors, the capacitor $C_{c1}$ may be connected to the drain of the third switching element $M_{o3}$ and the source of the fourth switching element $M_{o1}$, and may be connected to the output signal OUT.

When the capacitor $C_{c1}$ is directly connected to the output of the input circuit, the capacitor $C_{c1}$ may operate as a feedforward path, thereby forming a positive zero. The positive zero may refer to a situation in which as a signal given at a compensation front end goes to a high frequency, more components directly pass through the capacitor $C_{c1}$ such that a phase of the signal is not reversed and the signal is transmitted.

The third switching element $M_{o3}$ may be connected between the output end of the input circuit and the capacitor $C_{c1}$, and thus the capacitor $C_{c1}$ may not be directly connected to an output of the input circuit, and no positive zero may be formed. In addition, when the third switching element $M_{o3}$ is a PMOS transistor, the capacitor $C_{c1}$ is connected to the source of the third switching element $M_{o3}$, and thus a current may be buffering due to an effect of a common gate amplifier. Accordingly, the bandwidth of the output signal OUT may increase, and a frequency compensation may be facilitated.

The capacitor $C_{c2}$ may perform the same role as the capacitor $C_{c1}$. The capacitor $C_{c2}$ may be connected between the node $N_{o2}$ between the switching element $M_{o4}$ and the switching element $M_{o5}$ and the output end of the output circuit. The switching element $M_{o4}$ may be connected in parallel to the first switching element $M_3$ and the second switching element $M_4$. The switching element $M_{o4}$ may be connected in parallel to the switching element $M_1$ and the switching element $M_2$. In addition, the switching element $M_{o4}$ may be connected to the capacitor $C_{c2}$. The switching element $M_{o5}$ may be connected to the switching element $M_{o4}$ and the switching element Mos. One end of the switching element $M_{o5}$ may be connected to the ground GND, and the other end may be connected to the capacitor $C_{c2}$.

When the switching element $M_{o4}$ and the switching element $M_{o5}$ are NMOS transistors, the capacitor $C_{c2}$ may be connected to the drain of the switching element $M_{o5}$ and the source of the switching element $M_{o4}$, and may be connected to the output signal OUT.

The first switching element $M_3$ may include either NMOS transistor or PMOS transistor, and the second switching element $M_4$ may include a switching element of a different type from the type of the first switching element $M_3$. For example, when the first switching element $M_3$ is an NMOS transistor, the second switching element $M_4$ may be a PMOS transistor.

The first switching element $M_3$, the switching element $M_2$, the second switching element $M_4$, and the switching element $M_1$ may be formed in a mesh structure. The first switching element $M_3$ is cascoded to the switching element $M_1$. When the switching element $M_1$ is an NMOS transistor, the first switching element $M_3$ may be an NMOS transistor. The second switching element $M_4$ is cascoded to the switching element $M_2$. When the switching element $M_2$ is a PMOS transistor, the second switching element $M_4$ may be a PMOS transistor.

The mesh structure may reduce voltage changes of the nodes $N_1$ and $N_2$ to which the mesh structure and the output end of the input circuit are connected due to a cascode shielding property. In addition, the mesh structure may reduce the output swing of the nodes $N_1$ and $N_2$. Although, FIG. 5 illustrates a mesh structure with four switching elements, the disclosure is not limited thereto, and as such, according to another example embodiment, the number of switching elements within the mesh structure may different than four. For instance, the number of switching elements within the mesh structure may be greater than four or less than four.

In the output circuit 520, the fourth switching element $M_{o1}$, the third switching element $M_{o3}$, the switching element $M_2$, and the switching element $M_{o2}$ may form a translinear loop to perform a rail-to-rail output. In addition, the switching element $M_{o4}$, the switching element $M_{o5}$, the switching element $M_1$, and the switching element $M_{o6}$ may form the translinear loop to perform the rail-to-rail output.

In FIG. 5, the circuit configuration of the amplifier 500 according to an example embodiment is shown, but it is generally understood by those skilled in the art that various combinations of NMOS transistor or PMOS transistor forming each switching element may be configured according to modifications of other example embodiment.

Figure 6:
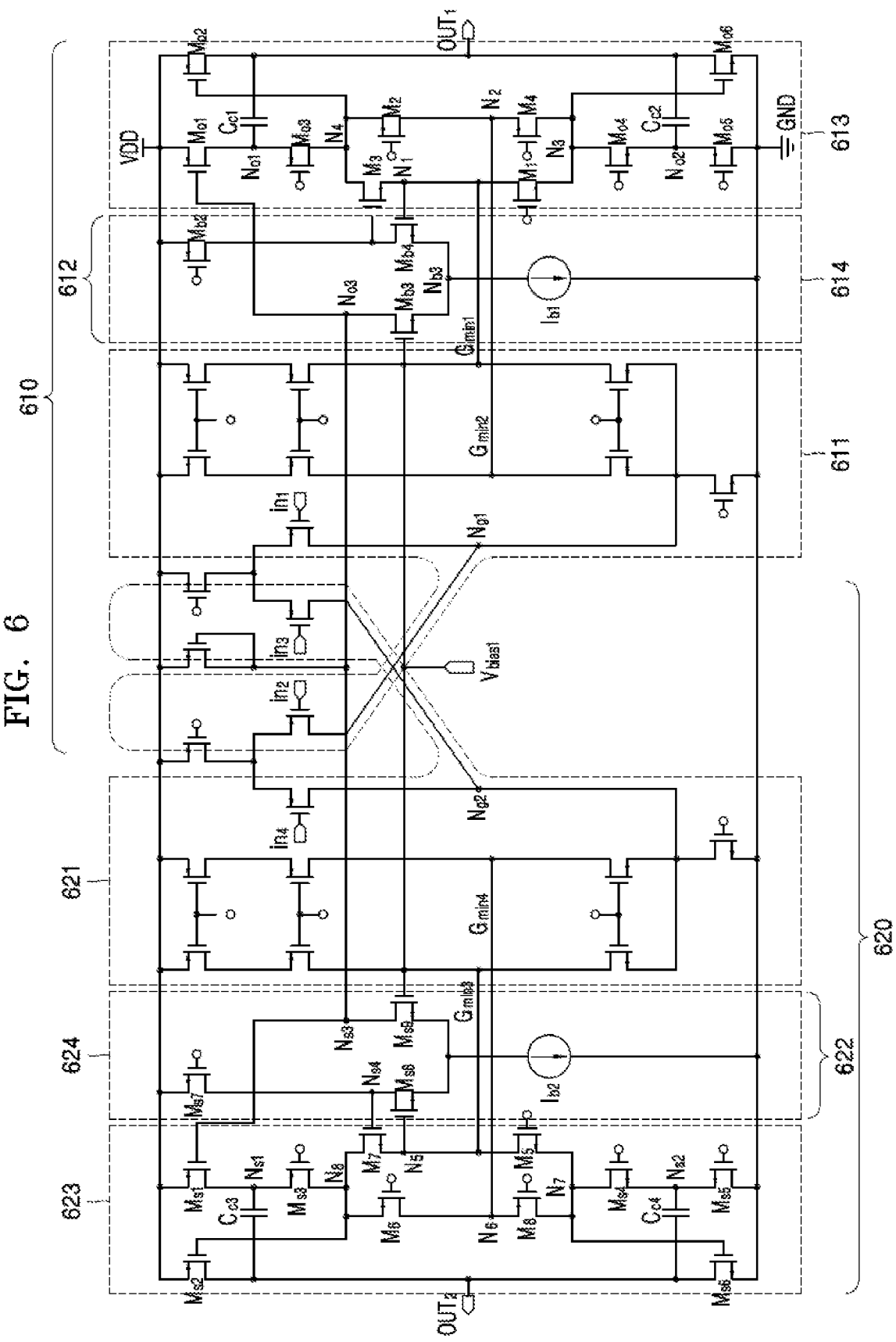
FIG. 6 is a diagram illustrating a circuit diagram of an amplifier including a first circuit and a second circuit according to an example embodiment.

FIG. 6 is a diagram illustrating a circuit diagram of an amplifier 600 including a first circuit 610 and a second circuit 620 according to an example embodiment.

Referring to FIG. 6, the amplifier 600 may include the first circuit 610 and the second circuit 620. The first circuit 610 may include a first input circuit 611, a first biasing circuit 612, and a first output circuit 613. The first circuit 610 may output a first output signal $OUT_1$, and the first output signal $OUT_1$ may refer to an output signal output from the first output circuit 613. Meanwhile, the amplifier 600, the first biasing circuit 612, the first output circuit 613, and the first amplification circuit 614 of FIG. 6 respectively correspond to the amplifier 500, the biasing circuit 510, the output circuit 520, and the first amplification circuit 511 of FIG. 5, and the first input circuit 611 of FIG. 6 corresponds to the input circuit 210 of FIG. 2, and thus redundant descriptions are omitted. For instance, the unlabeled elements of the input circuits 610 and 620 may correspond to the respective labeled elements in the input circuit 210 in FIG. 2.

The second circuit 620 may output a second output signal $OUT_2$, and the second output signal $OUT_2$ may refer to an output signal output from the second output circuit 623. The second output signal $OUT_2$ may be a signal having a differential relationship with the first output signal $OUT_1$.

The second circuit 620 may include a second input circuit 621, a second biasing circuit 622, and a second output circuit 623, and the second biasing circuit 622 may include a third amplification circuit 624. The second input circuit 621 may convert a third input signal in and a fourth input signal $in_4$ into current. According to an example embodiment, the second input circuit 621 includes a node $N_{g2}$ connected to the third input signal in and the fourth input signal $in_4$.

The current converted from the second input circuit 621 may be a differential input current, and the differential input current may include a third signal $G_{min3}$ and a fourth signal $G_{min4}$.

The second biasing circuit 622 may reduce a voltage change of an output end of the second input circuit 621. The second biasing circuit 622 may include a third amplification circuit 624 that amplifies a voltage of the output end of the second input circuit 621. The second output circuit 623 may include a fifth switching element $M_7$ connected to the output end of the second input circuit 621 so as to reduce the voltage change of the output end of the second input circuit 621. The third amplification circuit 624 may be connected to the fifth switching element $M_7$ to form a feedback loop for reducing the voltage change of the output end of the second input circuit 621.

An input end of the third amplification circuit portion 624 may be connected to a node $N_5$ between the fifth switching element $M_7$ and the output end of the second input circuit portion 621, and the output end of the third amplification circuit 624 may be connected the fifth switching element $M_7$ to form a feedback loop. Also, an input end of the third amplification circuit 624 may be connected to the first operating voltage $V_{bias1}$. The feedback loop connected to the fifth switching element $M_7$ may reduce a voltage change of the node $N_5$ of the output end of the second input circuit 621. Further, the feedback loop connected to the fifth switching element $M_7$ may increase a transconductance of the fifth switching element $M_7$ and may bias a bias voltage of the fifth switching element $M_7$. The bias voltage of the fifth switching element $M_7$ may mean a voltage applied to the fifth switching element $M_7$ so as to set an operating point of the fifth switching element $M_7$. The bias voltage of the fifth switching element $M_7$ may be a DC voltage.

The second output circuit 623 may include a sixth switching element $M_8$. The sixth switching element $M_8$ and the fifth switching element $M_7$ may be different types of switching elements. For example, when the fifth switching element $M_7$ is an NMOS transistor, the sixth switching element $M_8$ may be a PMOS transistor. As another example, when the fifth switching element $M_7$ is a PMOS transistor, the sixth switching element $M_8$ may be an NMOS transistor, but is not limited thereto.

The second biasing circuit 622 may include a fourth amplification circuit. The sixth switching element $M_8$ may amplify the voltage of the output end of the second input circuit 621 and may amplify a voltage of the node $N_6$ connected to the fourth amplification circuit. The fourth amplification circuit and the third amplification circuit 624 may be different.

An input end of the fourth amplification circuit may be connected to the node $N_6$ between the sixth switching element $M_8$ and the output end of the second input circuit 621, and the output end of the fourth amplification circuit may be connected to the sixth switching element $M_8$ to form a feedback loop.

Also, an input end of the fourth amplification circuit may be connected to a second operating voltage. The feedback loop connected to the sixth switching element $M_8$ may reduce a voltage change of the node $N_6$ of the output end of the second input circuit 621. The feedback loop connected to the sixth switching element $M_8$ may increase the transconductance of the sixth switching element $M_8$ and may bias the bias voltage of the sixth switching element $M_8$. The bias voltage of the sixth switching element $M_8$ may mean a voltage applied to the sixth switching element $M_8$ so as to set an operating point of the sixth switching element $M_8$. The bias voltage of the sixth switching element $M_8$ may be a DC voltage.

The second output circuit 623 may further include capacitors $C_{c3}$ and $C_{c4}$ that increase a bandwidth of the second output signal $OUT_2$. The capacitors Ccs and $C_{c4}$ may be used as compensation capacitors. The capacitor $C_{c3}$ may be connected between a node $N_{s1}$ between a switching element $M_{s1}$ and a switching element $M_{s3}$ and an output end of the second output circuit 623. The switching element $M_{s3}$ may be connected in parallel to the fifth switching element $M_7$ and the sixth switching element $M_8$, and the switching element $M_{s1}$ may be connected to the switching element $M_{s3}$.

The capacitor $C_{c4}$ may be connected between a node $N_{s2}$ between a switching element $M_{s4}$ and a switching element $M_{s5}$ and the output end of the second output circuit 623. The switching element $M_{s4}$ may be connected in parallel to the fifth switching element $M_7$ and the sixth switching element $M_8$, and the switching element $M_{s5}$ may be connected to the switching element $M_{s4}$.

Each of the first circuit 610 and the second circuit 620 may include two input signals. For example, the first circuit 610 may include the first input signal $in_1$ and the second input signal $in_2$, and the second circuit 620 may include the third input signal in and the fourth input signal $in_4$. According to an example embodiment, the first input circuit 611 includes a node $N_{g1}$ connected to the first input signal $in_1$ and the second input signal $in_2$.

In addition, each of the first circuit 610 and the second circuit 620 may include one output signal. For example, the first circuit 610 may include the first output signal $OUT_1$, and the second circuit 620 may include the second output signal $OUT_2$.

The first circuit 610 and the second circuit 620 may be connected to each other. The first biasing circuit 612 and the first output circuit 613 may be connected to the second biasing circuit 622 and the second output circuit 623. For example, the switching element $M_{s1}$ of the second circuit 620 may be connected to the power voltage VDD. The switching element $M_{s9}$ of the second circuit 620 may be connected to the first operating voltage $V_{bias1}$. The node $N_{s3}$ between the switching element $M_{s1}$ and the switching element $M_{s9}$ of the second circuit 620 may be connected to the node Nos between the fourth switching element $M_{o1}$ and the switching element $M_{b3}$ of the first circuit 610. Further, the node Nos may be connected to the first output circuit 613, and the node $N_{s3}$ may be connected to the second output circuit 623.

As the first circuit 610 and the second circuit 620 are connected to each other, the amplifier 600 may receive four input signals of the first input signal $in_1$, the second input signal $in_2$, the third input signal $in_3$, and the fourth input $in_4$, and may output the two output signals of the first output signal $OUT_1$ and the second output signal $OUT_2$. Also, a common mode CM of the first output signal $OUT_1$ and the second output signal $OUT_2$ may be controlled. By controlling the common mode CM, errors due to an abnormal influence may not be easily transferred to the output signal, and a THD may be reduced.

The second input circuit 621, the second biasing circuit 622, the second output circuit 623, and the third amplification circuit 624 may respectively have the same functions and structures as those of the first input circuit 611, the first biasing circuit 612, the first output circuit 613, and the first amplification circuit 614.

According to an example embodiment, the third amplification circuit 624 may include switching elements $M_{s8}$, $M_{s9}$, $M_{s7}$ and a current source $I_{b2}$. Moreover, according to an example embodiment, the output circuit 623 may include switching elements $M_5$, $M_6$ and $M_{s6}$ and node $N_7$.

According to an example embodiment, the gates of the switching elements that are connected to "o" indicates that the gates of these switching element may be connected to a bias voltage applied to each of switching elements so as to set an operating point of each of the switching elements.

Figure 7:
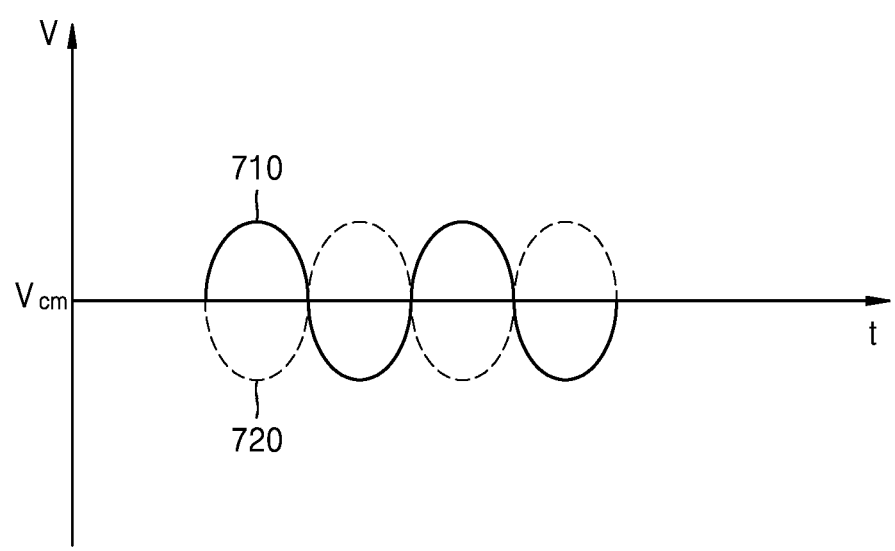
FIG. 7 is a diagram illustrating an output signal of an amplifier according to an example embodiment.

FIG. 7 is a diagram illustrating an output signal of an amplifier according to an example embodiment.

Referring to FIG. 7, the output signal of the amplifier may include a first output signal 710 output from a first circuit and a second output signal 720 output from a second circuit. The vertical axis of the graph of FIG. 7 may indicate voltage V, and the horizontal axis of the graph of FIG. 7 may indicate time t. In FIG. 7, the first and second output signals 710 and 720 are shown in the form of a sine wave, but are not limited thereto, and may be shown in the form of a square wave or the like.

The output signal may swing with respect to a common mode voltage $V_{cm}$. The first output signal 710 and the second output signal 720 may refer to voltages having a differential relationship with each other. The voltages having the differential relationship may be voltages having opposite polarities, or voltages in which the same amount increases or decreases from an arbitrary reference voltage.

When the first circuit and the second circuit are not connected to each other, the common mode voltage $V_{cm}$ of the first output signal 710 and the common mode voltage $V_{cm}$ of the second output signal 720 may be different from each other, and loss of the first output signal 710 and the second output signal 720 may increase. However, when the first circuit and the second circuit are connected to each other, the common mode voltage $V_{cm}$ of the first output signal 710 and the second output signal 720 may be equally controlled, and the first output signal 710 and the second output signal 720 may swing with respect to the same common mode voltage $V_{cm}$.

Figure 8:
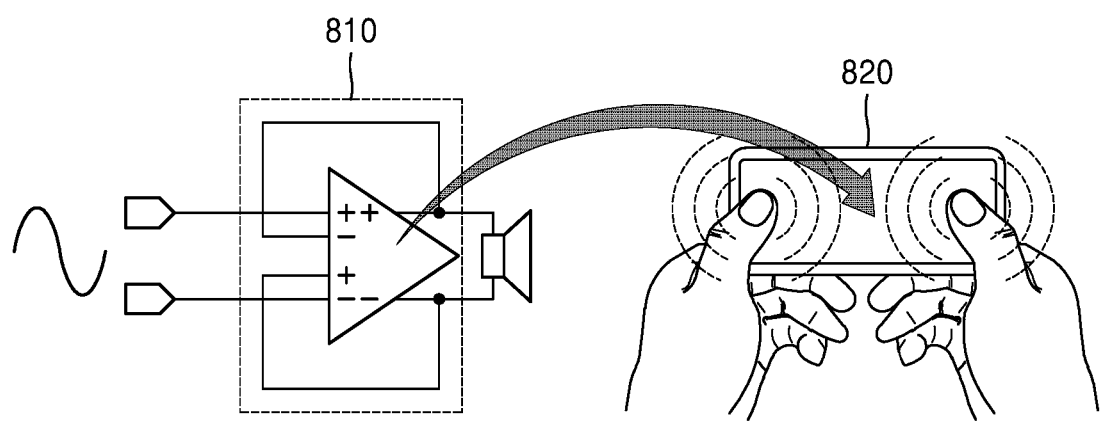
FIG. 8 is a diagram illustrating an application of an amplifier according to an example embodiment.

FIG. 8 is a diagram illustrating an application form of an amplifier 810 according to an example embodiment.

Referring to FIG. 8, the amplifier 810 may have four input signals and two output signals. The amplifier 810 of FIG. 8 corresponds to the amplifier 600 of FIG. 6, and thus redundant descriptions are omitted.

The amplifier 810 may operate as a buffer by connecting an output end of the amplifier 810 to an input end of the amplifier 810. For example, a positive output end of the amplifier 810 may be connected to a negative input end of the amplifier 810, and a negative output end of the amplifier 810 may be connected to the other negative input end of the amplifier 810 such that the amplifier 810 operates as the buffer having a gain of 1.

The amplifier 810 may be provided before driving a final load after passing through a device that performs an amplification function and a device that performs signal processing such as a filter. The amplification function may be an arbitrary function. The amplifier 810 may be disposed before driving the final load, thereby separating the final load from the device that performs the amplification function and the device such as the filter. Accordingly, an abnormal operation of the device that performs signal processing may be prevented, and a signal processing result may be stable regardless of a load. Further, the amplifier 810 may minimize distortion of an output of the device that performs signal processing and transmit the distortion to the load. The device that performs signal processing may be a digital to analog converter (DAC), a microphone, a low noise amplifier (LNA), and the load may be a speaker or an analog to digital converter (ADC), but the present disclosure is not limited thereto.

The amplifier 810 may be applied to a variety of application 820. The application 820 may be a mobile audio amplifier, a smart speaker mic array signal input amplifier, an amplifier fora mobile phone receiver, etc., but is not limited thereto. For example, the amplifier 810 may be mounted on a mobile device and used as the mobile audio amplifier, and may amplify a signal input from a microphone of the mobile device and transmit the signal to a speaker of the mobile device.

The amplifier 810 may be utilized in low power, high resolution, and low noise sensor applications. For example, the amplifier 810 may be used to transmit an audio signal output from a piezo microphone to a speaker. The amplifier 810 may be used in high resolution sensing multi-channel applications. For example, the amplifier 810 may be used in a small bio-medical device and an implant device. In addition, the amplifier 810 may be used for a wearable device, a mobile phone, or the Internet of Things (IoT).

Figure 9:
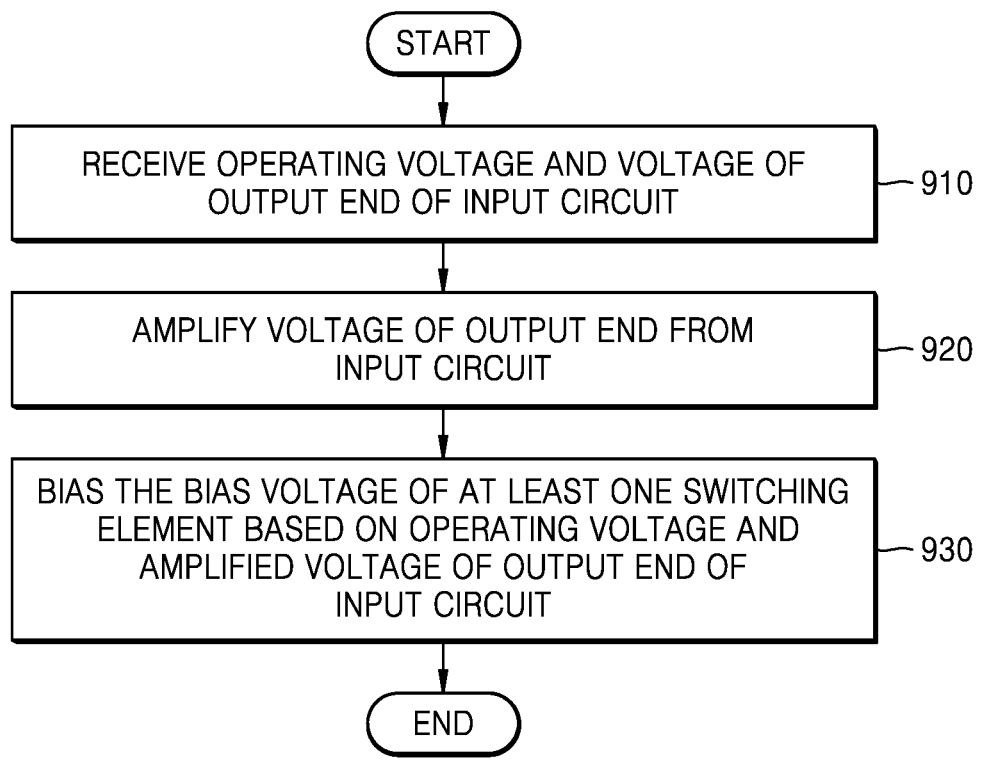
FIG. 9 is a flowchart illustrating an operation of a biasing circuit according to an example embodiment.

FIG. 9 is a flowchart illustrating an operation of a biasing circuit according to an example embodiment.

Descriptions of operations of an amplifier of FIG. 9 are related to the example embodiments described in the drawings of FIGS. 1 to 8, and thus the descriptions given in the drawings of FIGS. 1 to 8 may also be applied to the method of FIG. 9 even though omitted below.

Referring to FIG. 9, in operation 910, the biasing circuit may receive a first operating voltage and a voltage of an output end of an input circuit. The biasing circuit may include a first amplification circuit, and the first amplification circuit may receive a first operating voltage and the voltage of the output end of the input circuit. For example, the first amplification circuit may receive a first operating voltage from a positive input end, and may receive the voltage of the output end of the input circuit from a negative input end.

In operation 920, the biasing circuit may amplify the voltage of the output end of the input circuit. The first amplification circuit may amplify and output the voltage of the output end of the input circuit. An output end of the first amplification circuit may be connected to at least one switching element, and the at least one switching element may reduce a voltage change of the output end of the input circuit. For example, when the at least one switching element is a MOSFET, the output end of the first amplification circuit may be connected to a gate of the MOSFET.

In operation 930, the biasing circuit may bias a bias voltage of the at least one switching element based on the first operating voltage and the amplified voltage of the output end of the input circuit. For example, when the at least one switching element connected to the biasing circuit is the first switching element, the biasing circuit may bias the bias voltage of the first switching element based on the first operating voltage and the amplified voltage of the output end of the input circuit. As another example, when the first switching element is the MOSFET, the biasing circuit may bias a gate voltage of the MOSFET based on the first operating voltage and the amplified voltage of the output end of the input circuit.

In addition, the biasing circuit may reduce a voltage change of the output end of the input circuit. The output end of the input circuit and the input end of the first amplifier circuit may be connected to each other, and the output end of the first amplifier circuit may be connected to the at least one switching element to form a feedback loop. The voltage change of the output end of the input circuit may be reduced by the formed feedback loop.

Meanwhile, the above described example embodiments may be written in a program executable on a computer, and may be implemented on a general purpose digital computer that operates the program using a computer readable recording medium. In addition, the structure of data used in the above described embodiments may be recorded on a computer readable recording medium through various means. The computer readable recording medium includes a storage medium such as a magnetic storage medium (e.g., ROM, floppy disk, hard disk, etc.), an optical reading medium (e.g., CD ROM, DVD, etc.).

It will be understood by those of ordinary skill in the art that various changes in form and details may be made therein without departing from the spirit and scope of the disclosure as defined by the appended claims. Therefore, it should be understood that the example embodiments are to be considered in an illustrative rather than a restrictive sense. The scope of the rights is set forth in the appended claims rather than the foregoing description and should be interpreted as including all differences within the equivalent range thereto.

It should be understood that example embodiments described herein should be considered in a descriptive sense only and not for purposes of limitation. Descriptions of features or aspects within each example embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. An amplifier comprising:
   an input circuit configured to convert an input signal into a current;
   an output circuit comprising at least one switching element and configured to provide an output signal; and
   a biasing circuit connected to the at least one switching element of the output circuit to form a feedback loop configured to adjust a voltage change of an output end of the input circuit,
   wherein the biasing circuit comprises a first input node connected to a first operating voltage of the amplifier and a second input node connected to a source node of the at least one switching element,
   wherein the output end of the input circuit is connected to the source node of the at least one switching element, and
   wherein the output circuit further comprises a capacitor configured to increase a bandwidth of the output signal.

2. The amplifier of claim 1, wherein the current is a differential input current.

3. The amplifier of claim 2, wherein the biasing circuit is configured to reduce the voltage change corresponding to the differential input current.

4. The amplifier of claim 1,
   wherein the at least one switching element comprises a first switching element connected to the output end of the input circuit,
   wherein the biasing circuit comprises a first amplification circuit configured to amplify a voltage of the output end of the input circuit, and wherein the first amplification circuit is connected to the first switching element to form the feedback loop configured to adjust the voltage change of the output end of the input circuit.

5. The amplifier of claim 4, wherein the first amplification circuit is configured to receive the first operating voltage and the voltage of the output end of the input circuit, and
bias a first bias voltage of the first switching element based on the first operating voltage and the voltage of the output end of the input circuit.

6. The amplifier of claim 4, wherein the first amplification circuit is configured to increase a transconductance (gm) of the first switching element.

7. The amplifier of claim 4,
wherein the at least one switching element further comprises a second switching element connected to the output end of the input circuit,
wherein the biasing circuit comprises a second amplification circuit configured to amplify the voltage of the output end of the input circuit, and
wherein the second amplification circuit is connected to the second switching element to form another feedback loop configured to adjust the voltage change of the output end of the input circuit.

8. The amplifier of claim 7, wherein the second amplification circuit is configured to receive a second operating voltage and the voltage of the output end of the input circuit, and
bias a second bias voltage of the second switching element based on the second operating voltage and the voltage of the output end of the input circuit.

9. The amplifier of claim 7, wherein the second amplification circuit is configured to increase a transconductance of the second switching element.

10. The amplifier of claim 1, wherein the at least one switching element comprises:
a first switching element and a second switching element each connected to the output end of the input circuit;
a third switching element connected to the first switching element and the second switching element, the first switching element and the second switching element being connected in parallel; and
a fourth switching element connected to the third switching element, and
wherein the capacitor is connected between a node between the third switching element and the fourth switching element and an output end of the output circuit.

11. The amplifier of claim 10,
wherein the first switching element comprises an N-channel metal-oxide-semiconductor field effect transistor (NMOSFET) or a P-channel metal-oxide-semiconductor field effect transistor (PMOSFET), and
wherein the second switching element comprises a switching element of a type different from a type of the first switching element.

12. The amplifier of claim 1,
wherein the input circuit, the biasing circuit, and the output circuit form a first circuit, and
wherein the amplifier further comprising:
a second circuit configured to output another output signal having a differential relationship with the output signal.

13. The amplifier of claim 12, wherein the second circuit is configured to convert an another signal input to the second circuit into an another current, and
adjust a voltage change corresponding to the converted another current.

14. The amplifier of claim 12, wherein
each of the first circuit and the second circuit comprises two input signals, and
each of the first circuit and the second circuit comprises one output signal.

15. A method of amplifying by an amplifier comprising:
converting an input signal received by an input circuit into a current;
outputting, by an output circuit including at least one switching element, an output signal; and
adjusting a voltage change of an output end of the input circuit by a biasing circuit connected to the at least one switching element of the output circuit in a feedback loop,
wherein the biasing circuit comprises a first input node connected to a first operating voltage of the amplifier and a second input node connected to a source node of the at least one switching element,
wherein the output end of the input circuit is connected to the source node of the at least one switching element, and
wherein the output circuit includes a capacitor configured to increase a bandwidth of the output signal.

16. An amplifier comprising:
an input circuit configured to output a first signal based on an input signal;
an output circuit including a first switching element, a second switching element, a third switching element and a fourth switching element, and configured to provide an output signal; and
a first biasing circuit including a first amplifier having a first input terminal, a second input terminal and a first output terminal,
wherein the first switching element is a transistor;
wherein a gate terminal of the first switching element is connected to the first output terminal of the first amplifier of the first biasing circuit,
wherein the first signal is provided at a first node between the first switching element and the second switching element,
wherein the first input terminal of the first amplifier is connected to a first operating voltage of the amplifier to receive the first operating voltage as a first input and the second input terminal is connected to the first node at a source terminal of the first switching element to receive the first signal as a second input so as to form a first feedback loop configured to adjust a voltage change of the first signal of the input circuit, and
wherein the output circuit further comprises a capacitor configured to increase a bandwidth of the output signal.

17. The amplifier according to claim 16, further comprising:
a second biasing circuit including a second amplifier having a third input terminal, a fourth input terminal and a second output terminal,
wherein a gate of the fourth switching element is connected to the second output terminal of the second amplifier of the second biasing circuit,
wherein a second signal output by the input circuit is provided at a second node between the third switching element and the fourth switching element,
wherein the third input terminal of the second amplifier is connected to a second bias voltage to receive the second bias voltage as a third input and the fourth input terminal is connected to the second node to receive the second signal as a fourth input so as to form a second feedback loop configured to adjust a voltage change of the second signal of the input circuit.

18. The amplifier of claim 16, wherein the first biasing circuit is configured to reduce the voltage change corresponding to the first signal.

19. The amplifier of claim 17, wherein the second biasing circuit is configured to reduce the voltage change corresponding to the second signal.

* * * * *